(12) United States Patent
Miller et al.

(10) Patent No.: US 10,751,824 B2
(45) Date of Patent: Aug. 25, 2020

(54) WORK STRING TUBING CONNECTION RESTORATION

(71) Applicant: Postle Industries, Inc., Cleveland, OH (US)

(72) Inventors: Robert F. Miller, Cleveland, OH (US); James D. Allen, Cleveland, OH (US); Steven L. Stefancic, Cleveland, OH (US)

(73) Assignee: Postle Industries, Inc., Cleveland, OH (US)

( * ) Notice: Subject to any disclaimer, the term of this patent is extended or adjusted under 35 U.S.C. 154(b) by 0 days.

(21) Appl. No.: 15/831,523

(22) Filed: Dec. 5, 2017

(65) Prior Publication Data

US 2018/0161909 A1    Jun. 14, 2018

Related U.S. Application Data

(60) Provisional application No. 62/432,086, filed on Dec. 9, 2016.

(51) Int. Cl.
| | |
|---|---|
| *B23K 9/00* | (2006.01) |
| *C22C 38/26* | (2006.01) |
| *C22C 38/22* | (2006.01) |
| *C22C 38/04* | (2006.01) |
| *B23K 9/167* | (2006.01) |
| *B23K 9/173* | (2006.01) |
| *E21B 17/00* | (2006.01) |
| *B23K 9/18* | (2006.01) |
| *C22C 38/38* | (2006.01) |
| *C22C 38/02* | (2006.01) |
| *B23K 35/24* | (2006.01) |
| *G01R 31/28* | (2006.01) |
| *B23K 9/04* | (2006.01) |

(Continued)

(52) U.S. Cl.
CPC .......... *B23K 9/0035* (2013.01); *B23K 9/0026* (2013.01); *B23K 9/048* (2013.01); *B23K 9/167* (2013.01); *B23K 9/173* (2013.01); *B23K 9/18* (2013.01); *B23K 35/24* (2013.01); *C22C 38/02* (2013.01); *C22C 38/04* (2013.01); *C22C 38/22* (2013.01); *C22C 38/26* (2013.01); *C22C 38/38* (2013.01); *C23C 30/005* (2013.01); *E21B 17/00* (2013.01); *E21B 17/042* (2013.01); *G01R 31/2822* (2013.01); *B23K 2101/04* (2018.08); *B23K 2103/04* (2018.08); *C22C 38/18* (2013.01); *E21B 17/1078* (2013.01); *E21B 17/1085* (2013.01)

(58) Field of Classification Search
CPC ..... E21B 17/042; B23K 9/048; B23K 9/0035; B23K 9/0026; B23K 9/167; B23K 9/173; B23K 9/18
See application file for complete search history.

(56) References Cited

U.S. PATENT DOCUMENTS

| 4,153,983 A | * | 5/1979 | Stockton | ................... B23P 6/02 123/193.2 |
| 4,194,031 A | * | 3/1980 | Cullum | ............... E21B 17/1085 138/109 |

(Continued)

*Primary Examiner* — Jason L Vaughan
*Assistant Examiner* — Amanda Kreiling
(74) *Attorney, Agent, or Firm* — Fay Sharpe LLP

(57) ABSTRACT

A hardfacing metal composition and method of restoring worn work string tubing by application of a hardfacing metal to the worn regions of the work string tubing.

24 Claims, 10 Drawing Sheets

(51) Int. Cl.
*C23C 30/00* (2006.01)
*E21B 17/042* (2006.01)
*B23K 101/04* (2006.01)
*B23K 103/04* (2006.01)
*C22C 38/18* (2006.01)
*E21B 17/10* (2006.01)

(56) References Cited

U.S. PATENT DOCUMENTS

| | | | | |
|---|---|---|---|---|
| 5,201,455 A | * | 4/1993 | Reynolds, Jr. | B23K 9/04 228/119 |
| 9,085,942 B2 | * | 7/2015 | Hashem | E21B 17/1085 |
| 2004/0206726 A1 | * | 10/2004 | Daemen | B23K 9/04 219/76.14 |

* cited by examiner

FIG. 10 Graph showing microhardness Values vs. inches the depth below the Surface of the hardfacing of Duraband® NC. Note there are no recorded values Above 30 Rc in the Heat Affected Zone.

FIG. 11 Graph showing microhardness Values vs. inches the depth below the Surface of the hardfacing of Postalloy 2891. Note there are no recorded values Above 30 Rc in the Heat Affected Zone.

FIG. 12 Graph showing microhardness values vs. inches the depth below the surface of the hardfacing of Postalloy 2892. Note there are no recorded values above 30 Rc in the Heat Affected Zone.

Coupling Dimensions

| D | | Nom. weight | d | | t | | d_w | | W | | L_4 | | Threads per inch |
|---|---|---|---|---|---|---|---|---|---|---|---|---|---|
| [in] | [mm] | [lbs/ft] | [in] | [mm] | [in] | [mm] | [in] | [mm] | [in] | [mm] | [in] | [mm] | |
| 2 ⅞ | 73,03 | 11,00 | 2,065 | 52,45 | 0,405 | 10,28 | 2,000 | 50,80 | 3,750 | 95,25 | 4,230 | 107,44 | 4 |
|  | 73,03 | 11,65 | 1,995 | 50,67 | 0,440 | 11,17 | 1,945 | 49,40 | 3,750 | 95,25 | 4,230 | 107,44 | 4 |
| 3 ½ | 88,90 | 16,70 | 2,480 | 62,99 | 0,510 | 12,95 | 2,406 | 61,11 | 4,500 | 114,30 | 4,240 | 107,69 | 4 |
|  | 88,90 | 17,05 | 2,440 | 61,97 | 0,530 | 13,46 | 2,375 | 60,32 | 4,563 | 115,90 | 4,240 | 107,69 | 4 |
| 4 | 101,60 | 19,00 | 3,000 | 76,20 | 0,500 | 12,70 | 2,920 | 74,16 | 5,000 | 127,00 | 4,760 | 120,90 | 4 |
|  | 101,60 | 22,50 | 2,780 | 70,61 | 0,610 | 15,49 | 2,700 | 68,58 | 5,188 | 131,77 | 4,760 | 120,90 | 4 |
| 4 ½ | 114,30 | 21,60 | 3,500 | 88,90 | 0,500 | 12,70 | 3,420 | 86,86 | 5,500 | 139,70 | 4,760 | 120,90 | 4 |
|  | 114,30 | 24,00 | 3,380 | 85,85 | 0,560 | 14,22 | 3,300 | 83,82 | 5,563 | 141,30 | 4,760 | 120,90 | 4 |
|  | 114,30 | 26,50 | 3,240 | 82,29 | 0,630 | 16,00 | 3,160 | 80,26 | 5,688 | 144,47 | 4,760 | 120,90 | |

November 1992 — Reference: Hydril Bulletin 2852-A — 1.6.2

FIG. 14

(Prior Art)

Coupling Dimensions — Hydril PH-6 Tubing Connection

| D | | Nom. weight | d | | t | | d_w | | W | | W_e | | L_4 | | Threads per inch |
|---|---|---|---|---|---|---|---|---|---|---|---|---|---|---|---|
| [in] | [mm] | [lbs/ft] | [in] | [mm] | [in] | [mm] | [in] | [mm] | [in] | [mm] | [in] | [mm] | [in] | [mm] | |
| 2 ⅜ | 60,33 | 5,95 | 1,867 | 47,42 | 0,254 | 6,45 | 1,805 | 45,84 | 2,906 | 73,81 | 2,782 | 70,66 | 3,050 | 77,47 | 6 |
|  | 60,33 | 6,20 | 1,853 | 47,06 | 0,261 | 6,63 | 1,795 | 45,59 | 2,938 | 74,62 | 2,794 | 70,96 | 3,050 | 77,47 | 6 |
|  | 60,33 | 7,70 | 1,703 | 43,25 | 0,336 | 8,53 | 1,645 | 41,78 | 3,125 | 79,37 | 2,924 | 74,26 | 3,050 | 77,47 | 6 |
| 2 ⅞ | 73,03 | 7,90 | 2,323 | 59,00 | 0,276 | 7,01 | 2,265 | 57,53 | 3,438 | 87,32 | 3,312 | 84,12 | 3,040 | 77,21 | 6 |
|  | 73,03 | 8,70 | 2,259 | 57,37 | 0,308 | 7,82 | 2,200 | 55,88 | 3,500 | 88,90 | 3,365 | 85,47 | 3,040 | 77,21 | 6 |
|  | 73,03 | 9,50 | 2,195 | 55,75 | 0,340 | 8,63 | 2,130 | 54,10 | 3,625 | 92,07 | 3,419 | 86,84 | 3,030 | 76,96 | 6 |
|  | 73,03 | 10,70 | 2,091 | 53,11 | 0,392 | 9,95 | 2,030 | 51,56 | 3,688 | 93,67 | 3,509 | 89,12 | 3,020 | 76,70 | 6 |
| 3 ½ | 88,90 | 12,95 | 2,750 | 69,85 | 0,375 | 9,52 | 2,687 | 68,24 | 4,313 | 109,55 | 4,189 | 106,40 | 3,350 | 85,09 | 6 |
|  | 88,90 | 15,80 | 2,548 | 64,71 | 0,476 | 12,09 | 2,485 | 63,11 | 4,500 | 114,30 | 4,367 | 110,92 | 3,340 | 84,83 | 6 |
| 4 | 101,60 | 13,40 | 3,340 | 84,83 | 0,330 | 8,38 | 3,275 | 83,18 | 4,625 | 117,47 | 4,514 | 114,65 | 3,320 | 84,32 | 6 |
| 4 ½ | 114,30 | 15,50 | 3,826 | 97,18 | 0,337 | 8,55 | 3,765 | 95,63 | 5,125 | 130,17 | 5,021 | 127,53 | 3,340 | 84,83 | 6 |
|  | 114,30 | 19,20 | 3,640 | 92,45 | 0,430 | 10,92 | 3,560 | 90,42 | 5,313 | 134,95 | 5,170 | 131,31 | 3,340 | 84,83 | 6 |

November 1992 — Reference: Hydril Catalogue 901, 1900 — 1.6.3

FIG. 15

(Prior Art)

WORK STRING TUBING CONNECTION RESTORATION

The present disclosure claims priority on U.S. Provisional Application Ser. No. 62/432,086 filed Dec. 9, 2016, which is incorporated herein by reference.

The present disclosure relates generally to metal alloys, particularly to hardfacing metals, and more particularly to a method of restoring work string tubing connections using a hardfacing metal alloy for improving and/or extending the service life of work string tubing.

BACKGROUND ON THE DISCLOSURE

Work string tubulars enable drilling engineers to access a wellbore after a well casing has been cemented and/or fracked. The construction of work string tubes is different from that of drill pipe in that the box and pin are integral upset regions within the tube itself. Drill pipe construction incorporates forged tool joints welded to a tube (see FIG. 1). Work string tubes are integrally formed tube members that are typically 2⅜" and 2⅞" in diameter and 30' long; however, other sizes tubes can be used (see FIG. 1). The work string tubes are generally formed of high strength metal such as P110 (0.26-0.35% C, 0.17-0.37% Si, 0.4-0.7% Mn, ≤0.02% P, ≤0.01% S, 0.8-1.1% Cr, ≤0.2% Ni, ≤0.2% Cu, 0.15-0.25% Mn, ≤0.08% V, ≤0.02% Al, bal. Fe), a widely used grade tube having various thread connections with a yield strength of about 110,000 psi, or PH6™ metal (a proprietary Hydril® connection). Work string tubes generally have a thinner metal thickness than standard drill pipe; thus, when work string tubes encounter excessive wear, the rehabilitation of the work string tubes is generally considered too difficult and worn work string tubes are generally discarded.

During a typical work string operation, the work string tube connections' outside diameter is subjected to considerable wear. In work string operations, the use of the work string tube is terminated when the upset outer diameter and inner diameter (i.e., upset wall thickness) calculates to less than an acceptable percent of the OEM torsional capacity for any specific type of work string tube. Generally, when the upset outer diameter and inner diameter calculates to less than 80% of the OEM torsional capacity for any specific type of work string tube, the work string tube is deemed unacceptable for further use in wellhole operations; however, for different operations and types of work string tubes, the value can be higher or lower than 80%. The tube body, however, which does not wear at the same rate as the upset connections, is typically still within specification and can typically be further used. However, because the connections between the work string tubes have been worn to less than acceptable use standards, the work string tube is downgraded to less than premium grade and is, therefore, unusable for further service in work string operations. Because of the severe wear of the tubing connection upset area, many work string tubes lay dormant in pipe yards throughout the oilfield country. The upset areas of the work string tubes are normally considered non-weldable because the welding arc used during a typically hardfacing operation generally penetrates through the thin wall of the work string tube and/or damages the threading in the box of the work string tube and renders the work string tube useless.

"Hardfacing" is an arc welding technique which involves applying a layer of hard material to a substrate for the purpose of increasing the wear and corrosion resistance of the substrate. The use of this technique has increased significantly over the recent years as the oil and gas industries have come to recognize that the substrates of softer, lower cost material can be hardfaced to have the same wear and corrosion resistance characteristics as the more expensive substrates of a harder material. Additionally, some existing substrates that have been rendered useless in the industry can be hardfaced to restore and/or improve the wear and abrasion characteristics of the original substrates.

Hardfacing involves the deposition of a hard layer by arc welding or thermal spraying. Conventional weld hardfacing is accomplished by oxyfuel welding (OFW), gas tungsten arc welding (GTA), gas metal arc welding (GMAW), shielded metal arc welding (SMAW) and flux-cored arc welding (FCAW). Plasma transferred arc (PTA) hardfacing and laser beam hardfacing can also be used.

In view of the prior art, there remains a need for a process which can circumvent the problems associated with hardfacing of the thin upset areas of the pin and box connections of work string tubing so that used work string tubing can be reused.

SUMMARY OF THE DISCLOSURE

The present disclosure is directed to a repaired work string tube and a novel method for applying a hardfacing composition to work string tubing (such as work string tubing that was previously classified as less than premium grade) so that such work string tubing can be upgraded to be used again in work string operations. The box of the work string tubing is internally threaded for reception of a threaded pin member and the box typically has a cylindrical outer surface. Likewise, the threaded pin member also typically has a cylindrical outer surface. The box and threaded pin member generally having an outer diameter that is greater than the outer diameter of the main body of the work string tubing, and typically have equal sized outer diameters; however, this is not required. As such, during use of the work string tubing, the box and threaded pin member are exposed to a higher degree of wear. Once such wear is calculated to result in the box and/or threaded pin member having less than an acceptable percent of the OEM torsional capacity of work string tube (e.g., generally less than 80% of OEM diameter, typically 60%-95% of OEM diameter and all values and ranges therebetween), the worn section of work string tube is removed from further service. In the past, such worn work string tube was discarded. The present disclosure is directed to a novel hardfacing process that enables the worn regions of the box and threaded pin member to be built up to at least its original OEM outer diameter without damaging the threads in the box and/or the threads on the threaded pin member. The novel method includes applying a layer of hardfacing metal composition (e.g., welded) on the cylindrical outer surface of the box and/or threaded pin member (and optionally on the pin upset area), thereby providing a restored work string tubing which can withstand further abrasions and/or wear and be used in continued operation.

During work string operation, the work string tube connections' outside diameter is subjected to considerable wear. When the upset wall thickness of the work string tube is less than an acceptable percent of the OEM torsional capacity for work string tube (e.g., less than 60%-90% and all values and ranges therebetween), the work string tube is rendered useless and cannot be used in further wellhole operations. The method of the present disclosure has been developed to enable the outer surface of the box and/or threaded pin member to be hardfaced to build up such worn surfaces without damaging the thread in the box and/or on the thread on the threaded pin member. The method of the present disclosure for the repair of the worn outer surface of the box of a work string tube includes the steps of 1) optionally cutting off or otherwise removing a front end portion of the box, 2) applying a hardfacing metal to the worn region of the box to build up the outer diameter of the box to at least its OEM outer diameter, and 3) optionally fixing the thread on the box at the front end region where a portion of the box was cut off. Optional step three can occur prior to and/or after the step of applying a hardfacing metal to the box. Generally, about 0.1-2 inches (and all values and ranges therebetween) of the front end portion of the box is removed prior to the hardfacing of the box, and typically about 0.25-1.5 inches of the front end portion of the box is removed prior to the hardfacing of the box. Generally, the amount of the front end portion of the box that is removed is less than 60% of the longitudinal length of the cavity of the box, and typically about 1%-60% (and all values and ranges therebetween) of the longitudinal length of the cavity of the box, and more typically less than 50% of the longitudinal length of the cavity of the box, and still more typically less than about 30% of the longitudinal length of the cavity of the box. Generally, the cutting of the box is by a mechanical means (e.g., saw blade, etc.), and not by a cutting torch. The removal of a small portion of the front end portion of the box forms a clean and uniform front surface on the box and removes any damaged, irregular or worn front edge surfaces or threads located at the front end region of the box. After a portion of the front portion of the box has been removed, the front end of the box can be optionally further processed (e.g., ground, polished, deburred, front end of the threading repaired, etc.). Such optional further processing can occur prior to, during and/or after the hardfacing metal being applied to the worn outer surface of the box.

The box of the work string tube can be further processed prior to applying a hardfacing metal to the worn outer surface of the box; however, this is not required. In one non-limiting embodiment, new threads can optionally be in the cavity of the box prior to and/or after the hardfacing metal being applied to the worn outer surface of the box. As can be appreciated, new threads can be optionally cut in the cavity of the box after hardfacing metal has been partially or fully applied to the worn outer surface of the box.

After the front end of the box has been cut and optionally further processed (e.g., new threads cut, ground, polished, deburred, etc.), the box of the work string tube is generally positioned at a location so that a hardfacing metal can be applied to the worn outer surface of the box. Likewise, the threaded pin member of the work string tube is generally positioned at a location so that a hardfacing metal can be applied to the worn outer surface of the threaded pin member. The process of applying the hardfacing metal to the outer surface of the threaded pin member and/or the box can be done by use of a conventional welder apparatus (e.g., arc welding machine).

During the application of the hardfacing metal to the outer surface of the threaded pin member and/or the box, a novel method for applying the hardfacing metal is typically used to minimize the amount of accumulated heat in the box region and/or the threaded region of the threaded pin member during the hardfacing operation so that the box and/or threaded pin member are not damaged during the hardfacing operation. In one non-limiting embodiment, when hardfacing metal is applied to the worn regions of the outer surface of the box, the application of the hardfacing metal starts at the front end region of the box and continues toward the end of the box. Generally, at the back end of the box, the box tapers toward the main body of the work string tube; however, the existence of a taper is not always present. This hardfacing method has been found to reduce the amount of heat accumulated in the box during the hardfacing operation. It has been found that when too much heat accumulates in the box during a hardfacing operation, the box can soften and become disfigured, the threads in the cavity of the box can be damaged, and/or holes from melted regions can form in thin areas of the box. Any of these adverse events can result in permanent and irreversible damage to the box, thereby making further repair of the box prohibitively costly and/or time consuming, thus not resulting in the further justification to attempt salvage of the worn work string tube. In another non-limiting embodiment, when hardfacing metal is applied to the worn regions of the outer surface of the threaded pin member, the application of the hardfacing metal starts at the region just rearward of the end of the threads and continues rearwardly toward the end of the threaded pin member. Generally, at the back end of the threaded pin member, the threaded pin member tapers toward the main body of the work string tube; however, the existence of a taper is not always present. This hardfacing method has been found to reduce the amount of heat accumulated in the threaded region of the threaded pin member during the hardfacing operation. It has been found that when too much heat accumulates in the threaded region of the threaded pin member during a hardfacing operation, the thread can soften and become disfigured or otherwise be damaged. Any of these adverse events can result in permanent and irreversible damage to the threaded pin member, thereby making further repair of the threaded pin member prohibitively costly and/or time consuming, thus not resulting in the further justification to attempt salvage of the worn work string tube.

When the hardfacing metal is applied to the outer surface of the threaded pin member and/or the box, the hardfacing generally terminates at the beginning of the tapered region that transitions between the main body of the work string tube and the threaded pin member or the box (when such taper exists); however, this is not required. In one non-limiting embodiment, the hardfacing metal is applied to less than about 70% of the outer surface of the tapered region, typically, the hardfacing metal is applied to about 0-70% (an all values and ranges therebetween) of the outer surface of the tapered region, more typically the hardfacing metal is applied to less than 50% of the outer surface of the tapered region, still more typically the hardfacing metal is applied to less than about 20% of the outer surface of the tapered region, yet more typically the hardfacing metal is applied to less than about 10% of the outer surface of the tapered region, and still yet more typically the hardfacing metal is applied to less than about 0% of the outer surface of the tapered region. When the hardfacing metal is not applied to the tapered region, the application of the hardfacing metal can stop right at the beginning of the tapered region or be stopped at some distance from the tapered region (e.g., 0.1-3 inches prior to the beginning of the tapered region and all values and ranges therebetween).

In one non-limiting aspect of the present disclosure, there is provided a method for restoring a work string tubing connection. A portion of the front end region of the box (e.g., 1 inch, etc.) can be removed and new threads can optionally be cut prior to applying a hardfacing metal to the outer surface of the box; however, this is not required. As can be appreciated, new threads can optionally be cut after the hardfacing operation. The worn work string tube is transferred to a welding machine (e.g., arc welding machine), and the worn outside diameter of the box is rebuilt to within specification. Generally, the outer diameter of the box after the hardfacing has been applied is 90-200% of the OEM diameter of the box (and all values and ranges therebetween), and typically the outer diameter of the box after the hardfacing has been applied is 95-125% of the OEM diameter of the box, and more typically the outer diameter of the box after the hardfacing has been applied is 100-110% of the OEM diameter of the box. The application of the hardfacing metal is started at the front end of the box and progresses to the end of the box or to the tapered end of the box. This starting point of the application of the hardfacing metal and the direction of applying the hardfacing metal to the box is used to reduce damage to the box during the hardfacing operation. By starting the application of the hardfacing metal at the front end of the box, the incidence of burn-through in the box (i.e., the creation of holes through the box) can be significantly reduced or avoided. The type of hardfacing metal applied to the worn areas of the work string tube is non-limiting. Generally, the composition of the hardfacing metal is the same or similar to the composition of the work string tube; however, this is not required. For example, the hardfacing metal can have an as-welded hardness similar to P110 hardness for a weld string tube formed of P110; however, this is not required. As can be appreciated, the chemical composition of such hardfacing material can be the same as or different from the P110 composition. The use of a welding material whose as-welded hardness is similar to the P110 hardness will result in a wear life similar to the original P110 connection. However, using a more abrasion-resistant material such as, for example, Postle Industries' Duraband® NC, will result in a wear life greater than the other softer metals. Duraband® (when used) has a hardness of from about 58 to about 62 Rockwell C (RC), whereas the original P110 material (when used) has a hardness of from about 26 to about 32 RC. Using Duraband® has many advantages, such as being casing-friendly. "Casing-friendly" is a term used in the oilfield industry to denote how any given hardfacing acts upon the casing during drilling operations. For example, a non-casing-friendly material such as tungsten carbide causes excessive wear on a casing that lines the wellbore and can cause damage to the casing which can eventually cause a blowout. "Casing" is defined as a pipe or tube used as a lining for a well. P110 (when used without hardfacing) is not casing-friendly, and a similar weld deposit (when used) will typically also not be casing-friendly.

In another and/or alternative non-limiting aspect of the present disclosure, during the application of the hardfacing material on the work string tube, the welding polarity is generally selected to be DC straight polarity (electrode negative). Such a weld setting has been found to result in a shallower deposit of the hardfacing material on the outer surface of the work string tube than compared to the use of DC reverse polarity (electrode positive) that is common in hardfacing operations. Also, the use of the DC straight polarity during the hardfacing operation results in little dilution and arc penetration into the box. As such, when the DC straight polarity welding setting is used, the worn areas on the work string tube (that were previously considered non-weldable due to the thin worn walls) were found to be restorable during a hardfacing operation.

Generally, one layer (e.g., about 0.01"-0.40" thick and all values and ranges therebetween) of hardfacing material is sufficient to return the box of the work string tube to its OEM outer diameter. As can be appreciated, more than one layer of hardfacing material can be applied to the work string tube. In one non-limiting embodiment, two layers of the hardfacing material can be applied to the work string. Generally, the first layer has a thickness that is greater than or equal to subsequent hardfacing layers; however, this is not required. In one non-limiting example, the work string has a single layer of hardfacing material applied to the box and/or threaded pin member of the work string that is about 0.07-0.2 inches (e.g., 0.094-0.17 inches, etc.). In another non-limiting example, the work string has two layers of hardfacing material applied to the box and/or threaded pin member of the work string wherein the first and second layers are about 0.05-0.2 inches (e.g., 0.075-0.17 inches, etc.).

In another and/or alternative non-limiting aspect of the present disclosure, the longitudinal length of the box and/or threaded pin member can be extended by using the hardfacing method of the present disclosure. The longitudinal length of the build-up is non-limiting and depends on how much of the box or threaded pin member has been worn prior to the rebuilding procedure. For example, 3-4 inches of the front end of the box (or some other length) may need to be removed due to excessive damage to such region of the box. The amount of box removal may result in the threaded end of a threaded pin member of another work string not being able to be fully threaded into the shortened box. As such, the rear end of the box can be extended along the length of the work string by use of the hardfacing method of the present disclosure by a distance that would create a repaired box that has sufficient length to enable the threaded end of a threaded pin member of another work string to be fully threaded into the repaired box. As with the hardfacing method for repairing the box, the hardfacing metal is first applied to the rear end of the box or at the region of the box that begins to taper downwardly toward the body of the work string, and the hardfacing material is continued to be applied rearwardly of the box to a distance that is to be used to extend the length of the box (e.g., 0.5-10 inches of box extension, etc.). After one or more layers of hardfacing metal are used to extend the longitudinal length of the box, the box can be optionally further processed (e.g., ground, polished, deburred, etc.). Also, after the one or more layers of hardfacing metal are used to extend the longitudinal length of the box, the box can be rethreaded so that new threads are extended into the extended region of the box; however, this is not required.

In another and/or alternative non-limiting aspect of the present disclosure, the entire area of the worn region on the box or threaded pin member can have a hardfacing material applied to such region; however, this is not required. The application of a hardfacing material on the complete worn region will yield a much greater contact area on the box and/or threaded pin member and thereby potentially reduce the wear rate on the box or pin as compared to a box or pin that only includes hardfacing material on a smaller region of the box or pin. Additionally, rebuilding the outer diameter of the box or pin to the same or slightly greater than the OEM diameter can be used to allow finishing tools, etc. to clear a path to operate.

In another and/or alternative non-limiting aspect of the present disclosure, there is provided a hardfacing metal alloy which is particularly useful for use as a metal surfacing on materials subjected to mechanical stresses (e.g., abrasions, wear, etc.) such as, but not limited to, work string tubing. The hardfacing metal of the present disclosure can be welded to a surface under various types of gas (e.g., carbon dioxide, argon, carbon dioxide-argon mixture, etc.), self-shielded (open arc) tubular wire, submerged arc electrode, etc. The hardfacing metal can be applied by use of a solid metal electrode, a metal cored electrode, or a flux cored electrode.

The hardfacing metal composition can include a combination of carbon, manganese, silicon, chromium, niobium, molybdenum, iron, nickel, etc. in proportional amounts wherein each component is believed to have a specific function. The carbon in the hardfacing metal is believed to influence the hardness level of the hardfacing metal. Generally, the carbon content of the hardfacing metal is at least about 0.05 weight percent of the hardfacing metal and less than about 1.5 weight percent. The manganese in the hardfacing metal is believed to function as a deoxidizer and to also reduce or prevent hot cracking of the hardfacing metal. Generally, the manganese content of the hardfacing metal is at least about 0.5 weight percent of the hardfacing metal and less than about 2 weight percent. The silicon in the hardfacing metal is believed to function as a deoxidizer for the hardfacing metal. Generally, the silicon content of the hardfacing metal is at least about 0.2 weight percent of the hardfacing metal and less than about 1.2 weight percent. The chromium in the hardfacing metal is believed to affect hardenability of the hardfacing metal. Generally, the chromium content of the hardfacing metal is at least about 1.5 weight percent of the hardfacing metal and less than about 9.5 weight percent. The niobium (when used) in the hardfacing metal is believed to increase the volume of niobium carbides formed in the hardfacing metal. Generally, the niobium content of the hardfacing metal is at least about 4 weight percent of the hardfacing metal and less than about 7 weight percent. The molybdenum (when used) in the hardfacing metal is believed to affect the hardenability and the volume of molybdenum carbides formed of the hardfacing metal. Generally, the molybdenum content of the hardfacing metal is at least about 0.5 weight percent of the hardfacing metal and less than about 2 weight percent. The iron in the hardfacing metal is used to obtain the desired iron content of the metal alloy. The hardfacing metal is generally formed of a majority of iron (e.g., 80-95 weight percent); however, this is not required. Nickel (when used) is believed to add strength and hardness to the hardfacing metal. Generally, the nickel content of the hardfacing metal, when used, is at least about 0.05 weight percent of the hardfacing metal and less than about 3 weight percent. As can be appreciated, the composition of the hardfacing metal can include other and/or alternative components to reduce or prevent sensitization of the hardfacing metal (e.g., nitrogen), to affect the corrosion resistance of the hardfacing metal, affect the strength, toughness and ductility of the hardfacing metal (e.g., nickel), and/or to increase the resistance of the hardfacing metal to tempering and/or to prevent sensitization of the hardfacing metal (e.g., vanadium); however, this is not required.

The hardfacing metal can be formed by blending and/or mixing one or more components together, which can then be melted by a heat source (such as a furnace) and formed into a single, blended hardfacing metal material; however, this is not required. The hardfacing metal can be in the form of a wire, cored wire, etc. In one non-limiting configuration, the hardfacing metal is formed in a wire having a diameter of about 0.045"; however, other wire sizes can be used.

The hardfacing metal can be applied to a surface of a substrate (e.g., work string tubing) by welding; however, other or alternative techniques can be used. In one non-limiting configuration, the polarity is electrode negative (spray mode); however, the polarity can also or alternatively be electrode positive (short circuit mode). The hardfacing metal to the work string tubing is typically applied under a shielding gas such as, for example, argon and/or carbon dioxide; however, this is not required. The ratio of argon to carbon dioxide is non-limiting, and can be from about 3:1 to about 9:1; however, this is not required. As can be appreciated, other shielding gasses (when used) can be used.

In one non-limiting example, the hardfacing material can include a combination of carbon, manganese, silicon, chromium, iron, molybdenum and/or niobium. In one non-limiting embodiment, the hardfacing material includes by weight: about 0.5% to about 2.5% carbon (and all values and ranges therebetween), about 0.01% to about 2% manganese (and all values and ranges therebetween), about 0.01% to about 2% silicon (and all values and ranges therebetween), about 4% to about 11% chromium (and all values and ranges therebetween), about 3% to about 9% niobium (and all values and ranges therebetween), and at least about 70% iron (e.g., the balance iron); and optionally include impurities and trace elements. The hardfacing material has a hardness of about 50-70 Rc (ISO 6508-1) (and all values and ranges therebetween), and typically about 55-65 Rc. One specific hardfacing electrode that can be used to form such hardfacing metal is set forth in Table 1.

TABLE 1

(Postalloy Duraband ®)

| Component | General Range | Specific Formulation |
|---|---|---|
| Carbon | 1-2 wt. % | 1.2 wt. % |
| Manganese | 0.5-1.5 wt. % | 0.9 wt. % |
| Silicon | 0.5-1.5 wt. % | 0.9 wt. % |
| Chromium | 6-10 wt. % | 8 wt. % |
| Niobium | 4-8 wt. % | 6 wt. % |
| Iron | 75-88 wt. % | Balance |

The non-limiting welding parameters used to apply a hardfacing metal to the outer surface of a pin or box or a work string tube using the electrode in Table 1 is set forth in Table 2:

TABLE 2

| Wire Size | 0.045" |
|---|---|
| Polarity | Electrode Negative (Spray Mode) |
| Shielding Gas | 75% Argon-25% $CO_2$ |
| Amperage | 180 |
| Voltage | 31 |
| Torch Angle | 16° |
| Torch Offset | 1" |
| Stickout | ⅝" |
| Oscillation | ⅜" |
| Oscillation Count | 60/min |
| Rotation | 1'-55"/revolution |
| Preheat Temperature | 70° F. |
| Interpass Temperature | 700° F. |

In a second non-limiting example, the hardfacing material can include a combination of carbon, manganese, silicon, chromium, iron and/or molybdenum. In one non-limiting example of the second non-limiting embodiment, the hardfacing composition includes by weight: about 0.01% to about 0.25% carbon (and all values and ranges therebetween), about 0.5% to about 2.5% manganese (and all values and ranges therebetween), about 0.01 percent to about 2% silicon (and all values and ranges therebetween), about 1% to about 3.5% chromium (and all values and ranges therebetween), about 0.01% to about 2% molybdenum (and all values and ranges therebetween), and at least about 85% iron (e.g., the balance iron); and optionally include impurities and trace elements. The hardfacing material has a hardness of about 25-40 Rc (ISO 6508-1) (and all values and ranges therebetween), and typically about 28-35 Rc. One specific hardfacing electrode that can be used to form such hardfacing metal is set forth in Table 3.

TABLE 3

(Postalloy TubeWeld 110 ™)

| Component | General Range | Specific Formulation |
|---|---|---|
| Carbon | 0.08-0.14 wt. % | 0.1 wt. % |
| Manganese | 1-2 wt. % | 1.5 wt. % |
| Silicon | 0.2-1 wt. % | 0.5 wt. % |
| Chromium | 1.5-3 wt. % | 2.5 wt. % |
| Molybdenum | 0.6-1.4 wt. % | 1 wt. % |
| Iron | 91-96.62 wt. % | Balance |

The non-limiting welding parameters used to apply a hardfacing metal to the outer surface of a pin or box or a work string tube using the electrode in Table 3 is set forth in Table 4:

TABLE 4

| | |
|---|---|
| Wire Size | 0.045" |
| Polarity | Electrode Positive (Short Circuit Mode) |
| Shielding Gas | 90% Argon-10% $CO_2$ |
| Amperage | 235 |
| Voltage | 21.5 |
| Torch Angle | 11.5° |
| Torch Offset | 1" |
| Stickout | ½' |
| Oscillation | ⅜" |
| Oscillation Count | 100/min |
| Rotation | 1'-55"/revolution |
| Preheat Temperature | 87° F. |
| Interpass Temperature | 650° F. |

In a third non-limiting embodiment, the hardfacing material can include a combination of carbon, manganese, silicon, chromium, iron, and/or molybdenum. In one non-limiting example of the third non-limiting embodiment, the hardfacing composition includes by weight: about 0.01% to about 1.2% carbon (and all values and ranges therebetween), about 0.01% to about 1.5% manganese (and all values and ranges therebetween), about 0.01% to about 1.5% silicon (and all values and ranges therebetween), about 1.5% to about 4% chromium (and all values and ranges therebetween), and about 0.01% to about 3% molybdenum (and all values and ranges therebetween), and at least about 85% iron (e.g., the balance iron); and optionally include impurities and trace elements. The hardfacing material has a hardness of about 25-40 Rc (ISO 6508-1) (and all values and ranges therebetween), and typically about 28-35 Rc. One specific hardfacing electrode that can be used to form such hardfacing metal is set forth in Table 5.

TABLE 5

(Postalloy 2891)

| Component | General Range | Specific Formulation |
|---|---|---|
| Carbon | 0.04-0.2 wt. % | 0.08 wt. % |
| Manganese | 0.4-1 wt. % | 0.7 wt. % |
| Silicon | 0.2-0.7 wt. % | 0.35 wt. % |
| Chromium | 1.8-3 wt. % | 2.25 wt. % |
| Molybdenum | 0.4-1.8 wt. % | 1 wt. % |
| Iron | 90-97.16 wt. % | Balance |

The non-limiting welding parameters of the alloy composition of the third embodiment are presented in Table 6:

TABLE 6

| | |
|---|---|
| Wire Size | 0.045" |
| Polarity | Electrode Negative (Spray Mode) |
| Shielding Gas | 75% Argon-25% $CO_2$ |
| Amperage | 220 |
| Voltage | 21.5 |
| Torch Angle | 11.5° |
| Torch Offset | 1" |
| Stickout | ½" |
| Oscillation | ⅜" |
| Oscillation Count | 100/min |
| Rotation | 1'-55"/revolution |
| Preheat Temperature | 70° F. |
| Interpass Temperature | 690° F. |

Generally, only one layer of the hardfacing metal is applied to the outer surface of the box and/or threaded pin member of the work string tube; however, this is not required. The weld bead of the hardfacing metal composition can be about 3/32" to about ¼" thick; however, this is not required.

During the application of the hardfacing metal to the worn surface of the work string tube, the work string tube can be rotated about its longitudinal axis; however, this is not required.

In one non-limiting aspect of the present disclosure, there is provided a method for improving use a work string tubing in well operations, the method comprising: 1) using a work string tubing in a wellbore to service a well until the workstring is worn and is no longer approved to be used in the well (e.g., outer diameter of box and/or threaded pin member has been worn to 80% or less of OEM diameter, etc.); 2) removing the worn work string tubing from the wellbore once the upset outer diameter and/or inner diameter calculates to be less than an acceptable percent of the OEM maximum torsional capacity for the work string tube (e.g., less than about 80%, etc.); 3) optionally disconnecting the box and pin of adjacently connected worn work string tubes; 4) optionally removing an end portion of the box of the worn work string tube and/or removing a damaged or worn end of the threaded portion of the threaded pin member; 5) optionally repairing or rethreading the thread in the worn box after the removal of the end portion of the box and/or repairing or rethreading the thread of the threaded portion of the threaded pin member; 6) applying a hardfacing metal to the box of the worn work string tube such that the outer diameter of the box is at or slightly greater than the OEM outer diameter of the box (e.g., 90-120% of the OEM diameter of the box and all values and ranges therebetween) and/or applying a hardfacing metal to the threaded pin member of the worn work string tube such that the outer diameter of the pin is at or slightly greater than the OEM outer diameter of the pin (e.g., 90-120% of the OEM diameter of the threaded pin member and all values and ranges therebetween); 7) optionally extending the longitudinal length of the box and/or threaded pin member by applying hardfacing metal to the end of the box and/or threaded pin member; 8) optionally rethreading the box and/or threaded pin member after the hardfacing metal has been applied to the box and/or threaded pin member; 9) optionally grinding, polishing, and/or deburring the box and/or threaded pin member after the hardfacing metal has been applied to the box and/or threaded pin member; 10) optionally reconnecting the hardfaced box of the work string tube to an OEM threaded pin member or rebuilt threaded pin member of another work string tube;

and 11) inserting the connected hardfaced work string tube into a well bore to further service the well.

In another and/or alternative non-limiting aspect of the present disclosure, there is provided a method of applying a hardfacing metal composition to a surface of a work string tube comprising: a) selecting a worn work string tube; and, b) applying a hardfacing metal composition at least partially on a worn surface of the work string tube.

It is one non-limiting object of the present disclosure to provide improved materials and methods for producing viable work string tubing having restored integrity and which offers savings in work string life.

It is another and/or alternative non-limiting object of the present disclosure to provide a hardfacing metal composition having improved abrasion-resistance which can be applied to work string tubing.

It is another and/or alternative non-limiting object of the present disclosure to provide a hardfacing metal composition suitable for restoring worn work string tubing.

It is another and/or alternative non-limiting object of the present disclosure to provide a hardfacing metal composition having abrasion-resistance characteristics, which can be applied to an outer surface of worn work string tubing, is capable of minimizing casing wear in a wellbore hole, and maximizes the wear resistance of the work string tubing.

It is another and/or alternative non-limiting object of the present disclosure to provide a method for applying a hardfacing metal composition to worn work string tubing at a work string tubing operation site, thereby extending the life of the work string tubing and improving the throughput at the work string tubing operation site.

It is another and/or alternative non-limiting object of the present disclosure to provide a method for repairing and reusing worn work string tube in well operations.

These and other objects and advantages will become apparent to those skilled in the art upon reading and following the description taken together with the accompanying drawings.

BRIEF DESCRIPTION OF THE DRAWINGS

Reference may now be made to the drawings which illustrate various non-limiting embodiments that the disclosure may take in physical form and in certain parts and arrangement of parts wherein:

FIG. 14 is a table showing various coupling dimensions of a work string tubing having four threads per inch; and, FIG. 15 is a table showing various coupling dimensions of a Hydril PH6 tubing connection having six threads per inch.

DETAILED DESCRIPTION OF THE NON-LIMITING EMBODIMENTS

The present disclosure is directed to a repaired work string tube and a novel method for applying a hardfacing composition to work string tubing (such as work string tubing that was previously classified as less than premium grade) so that the work string tubing can be used again in work string operations. In particular, the present disclosure is directed to a novel hardfacing process that enables the worn regions of the box and/or threaded pin member of a work string tube to be built up to at least its original OEM outer diameter without damaging the threads in the box and/or the threads on the threaded pin member. The novel method includes applying a layer of hardfacing metal composition (e.g., welded) on the cylindrical outer surface of the box and/or threaded pin member (and optionally on the pin upset area), thereby providing a restored work string tubing which can withstand further abrasions and/or wear and be used in continued operation.

Figure 1:
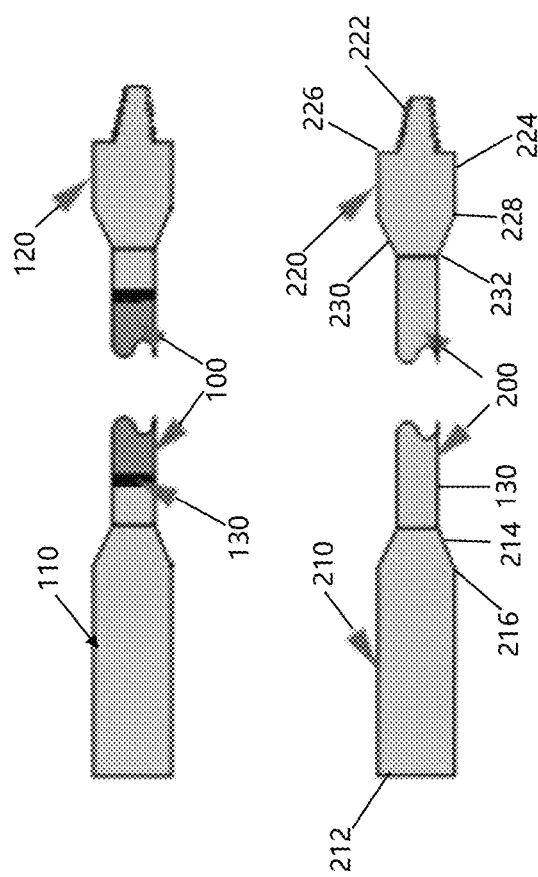
FIG. 1 is an illustration showing the differences between drill pipe and work string tubing.

Work string tubes are constructed differently from drill pipe, and thus are typically less durable. As illustrated in FIG. 1, drill pipes 100 typically include forged tool joints 110, 120 welded to the body of the drill pipe by a welded connection 130. These types of joints can be used since the walls of the drill pipe are sufficiently thick to enable a strong weld connection to be formed between the body of the drill pipe and the joints. Work string tubes 200 generally have thinner walls than the drill pipes, thus the joints 210, 220 are typically integrally formed with the body 202 of the work string tube to form a sufficiently string connection between the body and the joint. These work string tubes typically have a diameter of about 2⅜" to 2⅞" and are typically about 30' long; however, other sizes tubes can be used. As known in the art, joint 210 located at one end of the work string tube (known as the 'box') and includes a threaded cavity (not shown), and joint 220 that is located at the other end of the work string tube is known as the threaded pin member. The OEM outer diameter of joints 210 and 220 are greater than the OEM outer diameter of the body 202 of the work string as illustrated in FIG. 1. From the front end 212 of the box to the beginning 216 of the tapered region 214 of the box, the outer diameter of the box is generally constant. Generally, the longitudinal length of the constant diameter portion of the box represents about 60-98% of the total longitudinal length of the box. The tapered region 214 is illustrated as tapering at a generally constant angle from the beginning 216 of the taper portion to the end 218 of the taper portion. As also known in the art, joint 220 located at the other end of the work string tube (known as the 'threaded pin member') and includes a threaded portion 222 that terminates into the front wall of the upset portion 224 of the threaded pin member. From the front end 226 of the upset portion to the beginning 228 of the tapered region 230 of the box, the outer diameter of the upset portion is generally constant. Generally, the outer diameter of this portion of the upset portion is the same as the outer diameter of the box that is located between the front end 212 of the box to the beginning 216 of the tapered region 214; however, this is not required. The threaded portion 222 generally has an outer diameter that is less than the outer diameter of the upset portion 224 as illustrated in FIG. 1. The tapered region 230 is illustrated as tapering at a generally constant angle from the beginning 228 of the taper portion to the end 232 of the taper portion. Generally, the longitudinal length of the constant diameter portion of the upset portion represents about 50-80% of the total longitudinal length of the upset portion.

The method for using and maintaining work string tubing in well operations in accordance with the present disclosure includes the steps of 1) using a work string tubing in a wellbore to service a well until the work string tubing is worn and is no longer approved to be used in the well (e.g., outer diameter of box and/or upset portion of the threaded pin member has been worn to 80% or less (50-79.99%) of OEM diameter, etc.); 2) removing the worn work string tubing from the wellbore once the upset outer diameter and/or inner diameter calculates to be less than an acceptable percent of the OEM maximum torsional capacity for the work string tube (e.g., less than about 80% or less (50-79.99%), etc.); 3) optionally disconnecting the box and pin of adjacently connected worn work string tubes; 4) applying a hardfacing metal to the box of the worn work string tube such that the outer diameter of the box is at or slightly greater than the OEM outer diameter of the box (e.g., 90-150% of the OEM diameter of the box and all values and ranges therebetween [i.e., 95%-110%, etc.]) and/or applying a hardfacing metal to the worn upset portion of the threaded pin member such that the outer diameter of the upset portion is at or slightly greater than the OEM outer diameter of the upset portion (e.g., 90-150% of the OEM diameter of the box and all values and ranges therebetween [i.e., 95%-110%, etc.]); 5) optionally grinding, polishing, and/or deburring the box and/or threaded pin member prior to, during, and/or after the hardfacing metal has been applied to the box and/or threaded pin member; 6) optionally reconnecting the hardfaced box of the work string tube to an OEM threaded pin member or a rebuilt threaded pin member of another work string tube; and 7) inserting the connected hardfaced work string tube into a well bore to further service the well.

The method step 4) of applying a hardfacing metal to the box of the worn work string tube and/or applying a hardfacing metal to the threaded pin member of the worn work string tube includes a novel method of a) optionally removing an end portion of the box of the worn work string tube and/or removing a damaged or worn end of the threaded portion of the threaded pin member; b) optionally repairing or rethreading the thread in the worn box after the removal of the end portion of the box and/or repairing or rethreading the thread of the threaded portion of the threaded pin member; c) applying a hardfacing metal to the box and/or applying a hardfacing metal to the upset portion of the threaded pin member.

Figure 3:
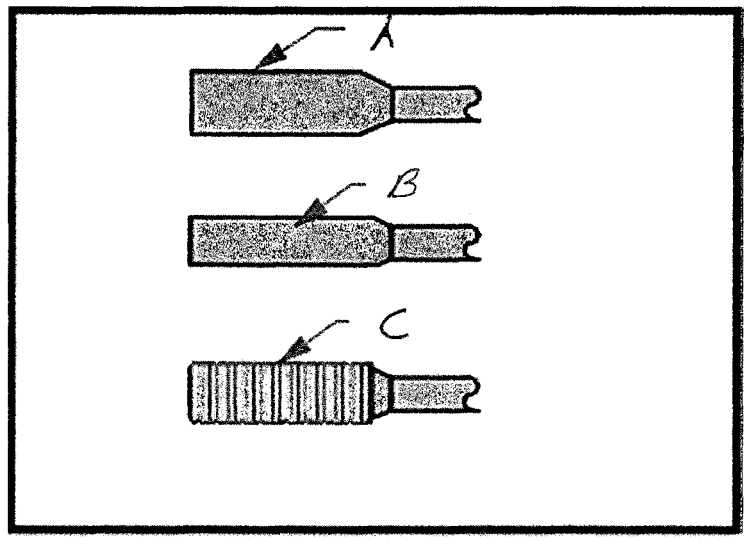
FIG. 3 is an illustration showing the process of work string tubing restoration in accordance with one non-limiting aspect of the present disclosure.

Referring now to FIG. 3, there is illustrated a work string tubing wherein the box is at the OEM diameter (A), the box is worn and is less than the OEM diameter (B), and the box has been repaired by hardfacing in accordance with the present disclosure and has an outer diameter that is equal to the OEM diameter (C). As illustrated in the third diagram of FIG. 3, the hardfacing metal was applied to the complete region of the box that has a constant outer diameter. As also illustrated in the third diagram of FIG. 3, the hardfacing metal was applied to only a portion of the tapered region 214 of the box. Generally, about 0-50% (and all values and ranges therebetween) of the tapered region is coated with the hardfacing metal, and typically about 0-20% of the tapered region is coated with the hardfacing metal, unless the longitudinal length of the box is to be extended.

Referring now to FIGS. 2 and 4-9, several different non-limiting hardfacing processes are illustrated that can be used to apply hardfacing metal to the box and/or the threaded pin member. In each one of the illustrated hardfacing processes, the direction of the application of the hardfacing metal on the box or the upset portion of the threaded pin member is toward the tapered region of the work string tubing. The novel method for applying the hardfacing metal to the box or the upset portion of the threaded pin member to repair worn portions of the work string so that the work string can be reused in accordance with the present disclosure, while minimizing or preventing 1) the softening and/or disfiguring of the box, 2) damage to the threads in the cavity of the box, 3) formation of holes or other damage in thin or worn areas of the box, 4) damage to the threaded region of the threaded pin member, and/or 5) any of type of damage to the box or threaded pin member, includes the steps of i) optionally cutting off or otherwise removing a front end portion of the box (e.g., removing a damaged and/or overly worn front end portion of the box, etc.) and/or removing a front portion of the threaded region of the threaded pin member (e.g., removing a damaged and/or overly worn front end portion of the threaded region of the threaded pin member, etc.), ii) applying one or more layers of a hardfacing metal to the outer surface of the box in a direction from the front end of the box towards the end of the box or the tapered end of the box, and/or applying a hardfacing metal to the outer surface of the upset portion of the threaded pin member in a direction from the front end of the upset portion to the end of the threaded pin member or the tapered end of the threaded pin member, iii) optionally further processing the box and/or threaded pin member by grinding, polishing, deburring, and/or heat treating the box and/or threaded pin member after the hardfacing metal has been applied to the box and/or threaded pin member, and iv) optionally repairing the threads or rethreading the threads in the cavity of the box and/or on the threaded region of the threaded pin member after the hardfacing metal has been applied to the box and/or threaded pin member.

When the box and/or threaded pin member of the work string tubing needs to be lengthened due to the removing of a portion of the front end of the box and/or the removing of the front end portion of the threaded region of the threaded pin member, the novel method for applying the hardfacing metal to the box or the upset portion of the threaded pin member in accordance with the present disclosure can optionally be used to lengthen the box and/or threaded pin member of the work string tubing. The method includes the steps of I) optionally cutting off or otherwise removing a front end portion of the box (e.g., removing a damaged and/or overly worn front end portion of the box, etc.) and/or removing a front portion of the threaded region of the threaded pin member (e.g., removing a damaged and/or overly worn front end portion of the threaded region of the threaded pin member, etc.), II) optionally applying one or more layers of a hardfacing metal to the outer surface of the box at a portion between the front end of the box and the beginning of the tapered region or the end of the box that has no tapered region in a direction from the front end of the box towards the end of the box or the tapered end of the box, and/or applying a hardfacing metal to the outer surface of the upset portion of the threaded pin member between the front end of the upset portion and the beginning of the tapered region or the end of the upset portion that has no tapered region in a direction from the front end of the upset portion to the end of the threaded pin member or the tapered end of the threaded pin member, III) applying one or more layers of a hardfacing metal to the outer surface of the box that includes the beginning of the tapered region or the end of the box that has no tapered region and continues to cover all or a portion of the tapered region and/or a portion of the body of the work string tubing (0.001-5% and all values and ranges therebetween of the longitudinal length of the body), and/or applying one or more layers of a hardfacing metal to the outer surface of the upset portion that includes the beginning of the tapered region or the end of the upset portion that has no tapered region and continues to cover all or a portion of the tapered region and/or a portion of the body of the work string tubing (0.001-5% and all values and ranges therebetween of the longitudinal length of the body), IV) optionally further processing the box and/or threaded pin member by grinding, polishing, deburring, and/or heat treating the box and/or threaded pin member after the hardfacing metal has been applied to the box and/or threaded pin member, V) optionally extending the longitudinal length of the cavity of the box by cutting further into the existing box and/or extended box and/or lengthen the threaded region of the threaded pin member by cutting into the front face of the existing unset portion of the threaded pin member, and VI) optionally repairing the threads or rethreading the threads in the cavity of the box and/or on the threaded region of the threaded pin member after the hardfacing metal has been applied to the box and/or threaded pin member to extend the longitudinal length of the box and/or threaded pin member.

Figure 2:
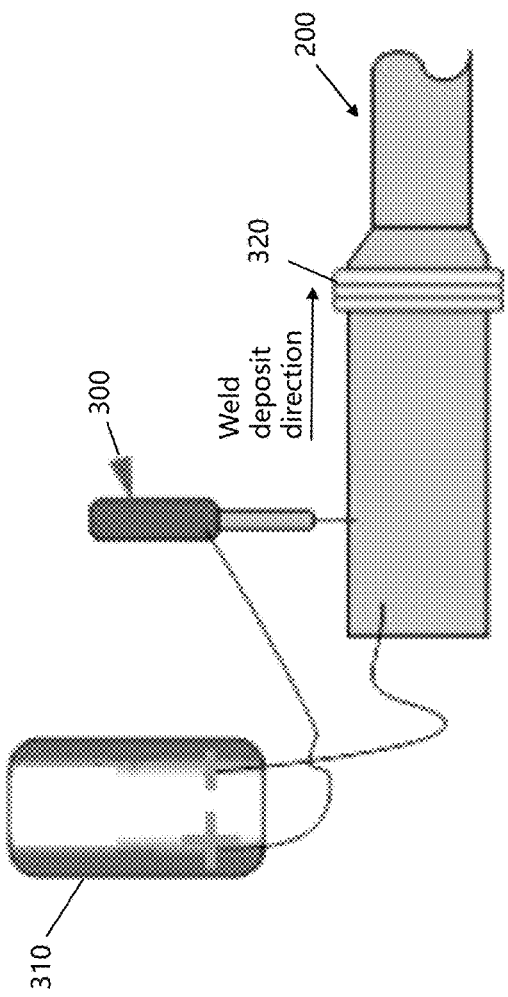
FIG. 2 is an illustration showing the process of hardfacing a worn work string tube in accordance with one non-limiting aspect of the present disclosure.

Referring again to FIG. 2, there is illustrated a work string tubing 200 wherein the joint 210 or box has a hardfacing metal 320 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 2 illustrates that only a portion of the outer surface of the box has hardfacing material applied to the box near the tapered end of the box. However, it can be appreciated that the complete outer surface of the box can be coated with a hardfacing metal as illustrated in the third picture of FIG. 3. The ribbons of hardfacing that are applied to the outer surface of the box are illustrated as being positioned directly adjacent to one another such that the edges of the ribbons of hardfacing metal are on contact with one another. The application of the hardfacing can be applied by using DC polarity (electrode negative). In one non-limiting arrangement, the width of the hardfacing bead applied to the outer surface of the box is about 0.5-2 inches (e.g., 1 inch, etc.) and has a thickness of about 0.04-0.3 inches (e.g., 0.094 inches, etc.). During the application of the hardfacing metal to the outer surface of the box, 1) the electrode can be moved along the longitudinal length and/or about the outer surface of the box or upset portion while the work string tubing is maintained in position, 2) the electrode can be moved along the longitudinal length and/or about the outer surface of the box or upset portion while the work string tubing is rotated and/or moved along its longitudinal axis, or 3) the electrode can maintained stationary while the work string tubing is rotated and/or moved along its longitudinal axis.

Figure 4:
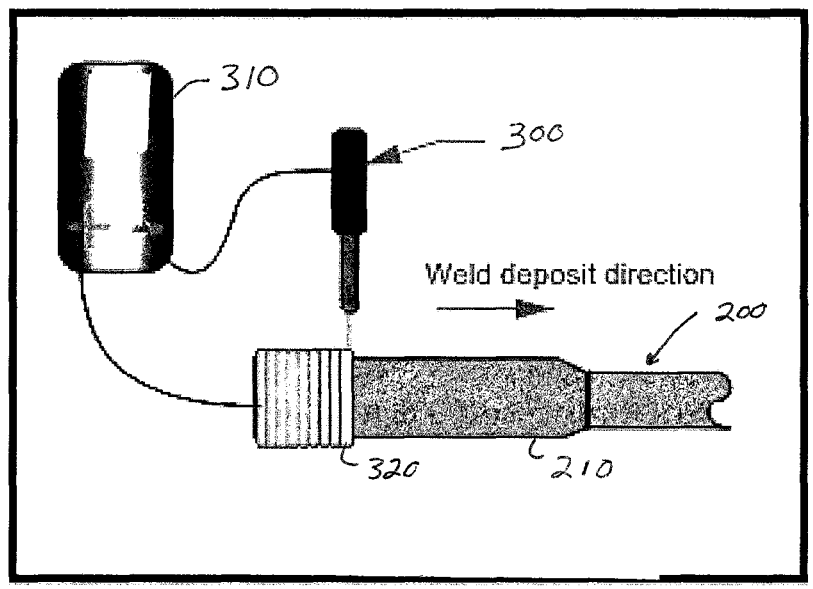
FIG. 4 is an illustration showing the hardfacing process with DC polarity (electrode negative) and weld bead direction from the threaded end progressing to the tapered end of the work string tubing.

Referring now to FIG. 4, there is illustrated a work string tubing 200 wherein the joint 210 or box has a hardfacing metal 320 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 4 illustrates that the hardfacing metal application started at the front end of the box and is progressing toward the tapered region of the box. The ribbons of hardfacing metal that are applied to the outer surface of the box are illustrated as being positioned directly adjacent to one another such that the edges of the ribbons of hardfacing metal are on contact with one another. The application of the hardfacing metal can be applied by using DC polarity (electrode negative). In one non-limiting arrangement, the width of the hardfacing bead applied to the outer surface of the box is about 0.5-2 inches (e.g., 1 inch, etc.) and has a thickness of about 0.04-0.3 inches (e.g., 0.094 inches, etc.). During the application of the hardfacing metal to the outer surface of the box, 1) the electrode can be moved along the longitudinal length and/or about the outer surface of the box or upset portion while the work string tubing is maintained in position, 2) the electrode can be moved along the longitudinal length and/or about the outer surface of the box or upset portion while the work string tubing is rotated and/or moved along its longitudinal axis, or 3) the electrode can maintained stationary while the work string tubing is rotated and/or moved along its longitudinal axis.

Figure 5:
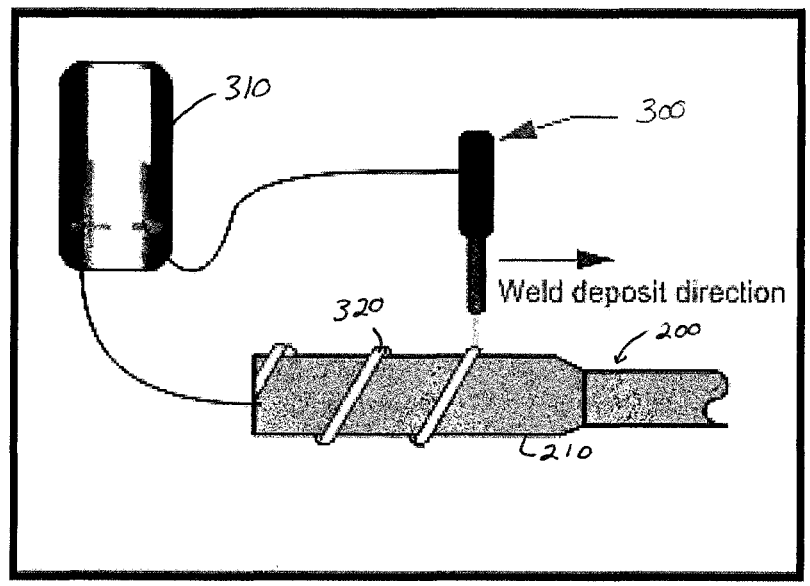
FIG. 5 is an illustration showing the non-oscillation hardfacing process with DC polarity (electrode negative) and weld bead direction from the threaded end progressing to the tapered end with spiral configuration.

Referring now to FIG. 5, there is illustrated a work string tubing 200 wherein the joint 210 or box has a hardfacing metal 320 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 5 illustrates that the hardfacing metal application started at the front end of the box and is progressing toward the tapered region of the box. The ribbons of hardfacing metal that are applied to the outer surface of the box are illustrated as being spaced from one another such that the edges of a ribbon of hardfacing metal does contact with one another. In such a hardfacing process, multiple ribbons of hardfacing metal will need to be applied to the box to fully cover the outer surface of the box at the region located between the front end of the box and the tapered region of the box. The application of the hardfacing metal can be applied by using DC polarity (electrode negative). In one non-limiting arrangement, the width of the hardfacing bead applied to the outer surface of the box is about 0.5-2 inches (e.g., 1 inch, etc.) and has a thickness of about 0.04-0.3 inches (e.g., 0.094 inches, etc.). During the application of the hardfacing metal to the outer surface of the box, 1) the electrode can be moved along the longitudinal length and/or about the outer surface of the box or upset portion while the work string tubing is maintained in position, 2) the electrode can be moved along the longitudinal length and/or about the outer surface of the box or upset portion while the work string tubing is rotated and/or moved along its longitudinal axis, or 3) the electrode can maintained stationary while the work string tubing is rotated and/or moved along its longitudinal axis.

Figure 6:
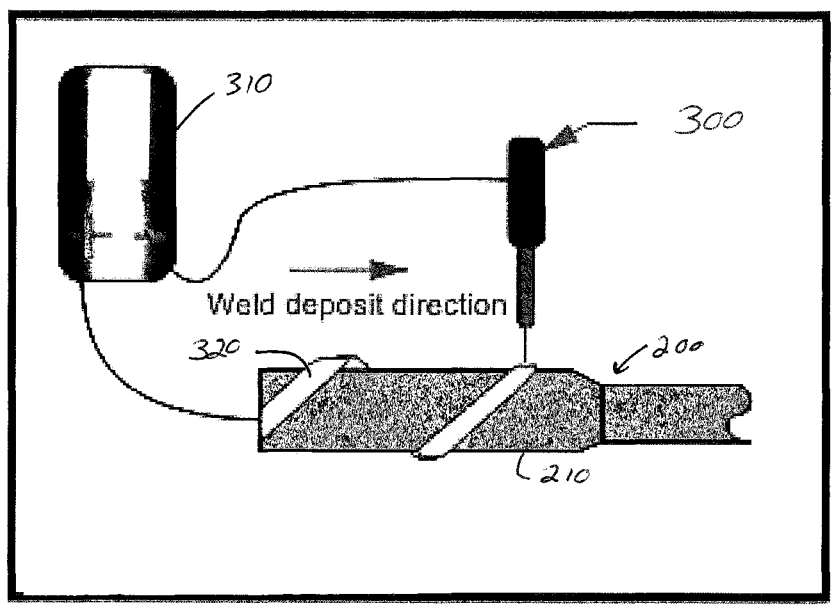
FIG. 6 is an illustration showing the oscillating hardfacing process with DC polarity (electrode negative) and weld bead direction from the threaded end progressing to the tapered end with spiral configuration.

Referring now to FIG. 6, the application of applying the hardfacing metal to the box of the work string tubing is similar to the hardfacing process illustrated in FIG. 5 except that the width of the hardfacing metal ribbon is wider and spaced farther apart.

Figure 7:
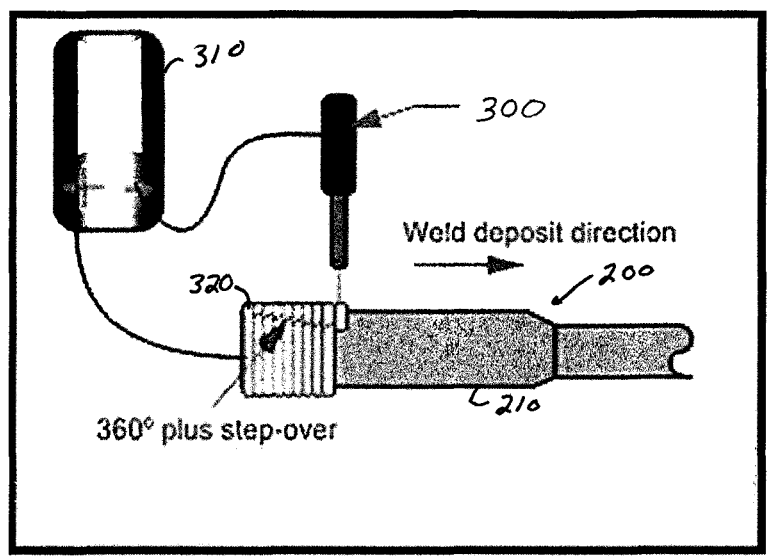
FIG. 7 is an illustration showing the hardfacing process with DC polarity and weld bead direction from the threaded end progressing to the tapered end using 360°+ step-overs.

Referring now to FIG. 7, there is illustrated a work string tubing 200 wherein the joint 210 or box has a hardfacing metal 320 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 7 illustrates that the hardfacing metal application started at the front end of the box and is progressing toward the tapered region of the box. The ribbons of hardfacing metal that are applied to the outer surface of the box are illustrated as positioned directly adjacent to one another such that the edges of the ribbons of hardfacing metal are in contact with one another. The ends of each ribbon are slightly stepped over the ends. Such step over is used to avoid the alignment of any defects that could lead to cracking.

Figure 8:
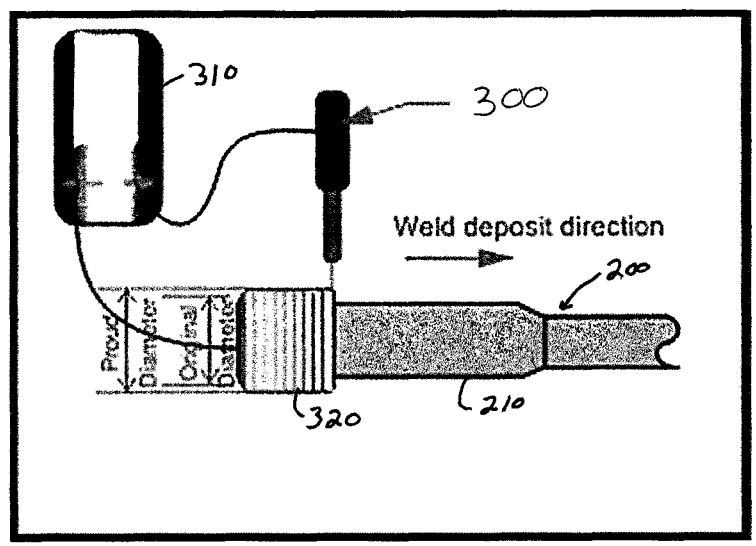
FIG. 8 is an illustration showing the hardfacing process with a proud diameter above the original diameter.

Referring now to FIG. 8, there is illustrated a work string tubing 200 wherein the joint 210 or box has a hardfacing metal 320 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 8 illustrates that the hardfacing metal application started at the front end of the box and is progressing toward the tapered region of the box. The ribbons of hardfacing metal that are applied to the outer surface of the box are illustrated as being positioned directly adjacent to one another such that the edges of the ribbons of hardfacing metal are on contact with one another. The application of the hardfacing can be applied by using DC polarity (electrode negative). In one non-limiting arrangement, the width of the hardfacing bead applied to the outer surface of the box is about 0.5-2 inches (e.g., 1 inch, etc.) and has a thickness of about 0.04-0.3 inches (e.g., 0.094 inches, etc.). As illustrated in FIG. 8, the application of the hardfacing metal to the box results in the outer diameter of the box being greater than the OEM outer diameter of the box. During the application of the hardfacing metal to the outer surface of the box, 1) the electrode can be moved along the longitudinal length and/or about the outer surface of the box or upset portion while the work string tubing is maintained in position, 2) the electrode can be moved along the longitudinal length and/or about the outer surface of the box or upset portion while the work string tubing is rotated and/or moved along its longitudinal axis, or 3) the electrode can maintained stationary while the work string tubing is rotated and/or moved along its longitudinal axis.

Figure 9:
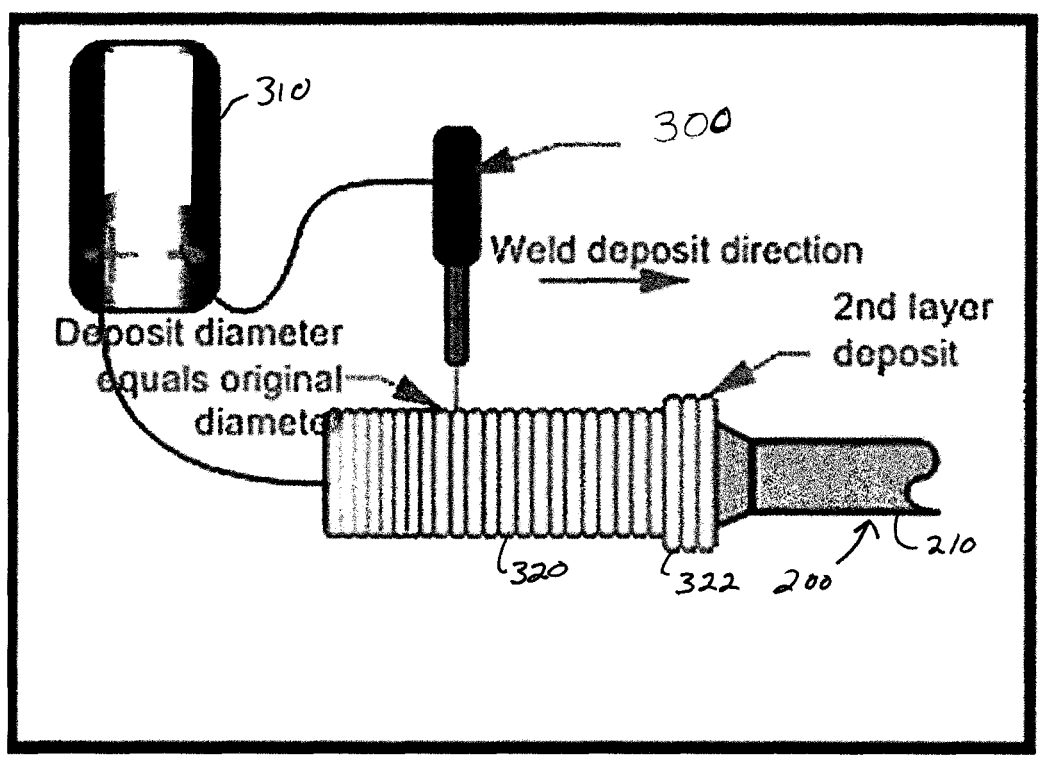
FIG. 9 is an illustration showing the hardfacing of the full length of the upset area with a second layer at or near the tapered end of the upset area.

Referring now to FIG. 9, there is illustrated a work string tubing 200 wherein the joint 210 or box has a first layer of hardfacing metal 320 and a second layer of hardfacing metal 322 applied to the outer surface of the box. Although not shown, one skilled in the art would understand that the threaded pin member could be hardfaced instead of the box. A welding torch 300 powered by a welding power supply 310 is used to melt a hardfacing electrode onto the outer surface of the box. As illustrated by the arrow, the welding torch is moved in the direction toward the tapered region of the box as the hardfacing metal is applied to the outer surface of the box. FIG. 9 illustrates that the hardfacing metal application started at the front end of the box and is progressing toward the tapered region of the box. The ribbons of hardfacing metal that are applied to the outer surface of the box are illustrated as being positioned directly adjacent to one another such that the edges of the ribbons of hardfacing metal are in contact with one another. The application of the hardfacing metal can be applied by using DC polarity (electrode negative). In one non-limiting arrangement, the width of the hardfacing bead applied to the outer surface of the box is about 0.5-2 inches (e.g., 1 inch, etc.) and has a thickness of about 0.04-0.3 inches (e.g., 0.094 inches, etc.). The two beads of the hardfacing metal can have the same or different width and/or thickness. As illustrated in FIG. 9, the application of the first layer of hardfacing metal to the box results in the outer diameter of the box being about the same as the OEM outer diameter of the box. The second layer of hardfacing metal is applied on top of the first layer of hardfacing metal. The hardfacing metal application for the second layer was also started in a direction from the front end of the box toward the tapered region of the box. The ribbons of the second layer of hardfacing metal that are applied to the outer surface of the box are also illustrated as being positioned directly adjacent to one another such that the edges of the ribbons of hardfacing metal are in contact with one another. As can be appreciated, the manner in which the first and second layer of hardfacing metal is applied to the box can be the same or different. For example, the first layer can be applied as illustrated in FIG. 5 or 6, and the second layer can be applied as illustrated in FIG. 4 or 7, or vice versa. The application of the second layer of hardfacing metal generally results in the outer diameter of the box being greater than the OEM diameter; however, this is not required. As illustrated in FIG. 9, the second layer of hardfacing metal is only located near the taper portion; however, it can be appreciated that the second layer can be applied to the complete box region that includes the first layer of hardfacing metal or at some portion of the box (e.g., front portion, mid region, or rearward region as illustrated in FIG. 9). During the application of the first and second layers of hardfacing metal to the outer surface of the box, 1) the electrode can be moved along the longitudinal length and/or about the outer surface of the box or upset portion while the work string tubing is maintained in position, 2) the electrode can be moved along the longitudinal length and/or about the outer surface of the box or upset portion while the work string tubing is rotated and/or moved along its longitudinal axis, or 3) the electrode can maintained stationary while the work string tubing is rotated and/or moved along its longitudinal axis.

The rebuilt work string tube can include a hardfacing as-welded deposit of similar or improved strength and/or hardness as the original upset area properties of the work string tube; however, this is not required. Generally, the hardfacing metal composition deposited on the surface of the work string tube provides improved abrasion- and/or wear-resistance properties to the work string tube.

The hardfacing metal composition can be deposited by any suitable welding means and methods such as, but not limited to, open arc, gas or flux shielded, etc. The welding electrode can be a solid wire, cored electrode, coated electrode or coated cored electrode. When the electrode is a coated and/or cored electrode, the coating and/or fill material in the core can include alloying agents, fluxing agents, slag agents, gas generating agents, etc. The electrode can be a self-shielding electrode and/or be used in the presence of a shielding gas. As such, the hardfacing metal can be applied by a variety of processes such as, but not limited to, submerged arc welding (SAW), shielded metal arc welding (SMAW), flux-cored arc welding (FCAW), gas metal arc welding (GMAW) or gas tungsten arc welding (TIG).

The hardfacing deposit can be, but is not limited to, Postalloy® Duraband® NC, whose properties generally equal or exceed the original hardness and strength properties of the original upset properties of the work string tube.

As discussed above, the weld bead of the hardfacing material is typically applied in a direction from the threaded end and progresses to the tapered end of the box. As such, the threads on the inner surface of the box will not be adversely affected (e.g., melted or deformed) during the hardfacing process, and openings in the thin walls of the box will not form during the hardfacing process. By starting the application of the hardfacing metal at the threaded end of the box, burn through of the wall of the worn box can be avoided because heat at or near the threaded end of the box can dissipate away from the box via the heat sink of the body of the work string tube, thereby preventing the temperature of the skin of the box during hardfacing from reaching a temperature sufficient to melt the threads and/or melt though the wall of the box.

The hardfacing deposit can be applied by a non-oscillating process such that the weld bead continually progresses forward to form a spiral configuration (see FIG. 5). The non-oscillating weld progression includes the entire area of the upset section. Multiple arc starts are generally required to accomplish complete area coverage with the hardfacing material.

The hardfacing deposit can be applied by an oscillating process such as, for example, a ⅜" wide oscillation (see FIG. 6); however, other and/or alternative dimensions may be used.

The hardfacing deposit can include a typical 1" (or other widths) wide oscillated hardfacing deposit with step-overs occurring at 360° to 370°, producing multiple beads for the length of the upset area (see FIG. 7); however, this is not required.

The final hardfacing deposit generally has a thickness such that the outer diameter of the box or threaded pin member that includes the hardfacing material has an outer diameter that is generally equal to or slightly greater than the OEM outer diameter of the box or threaded pin member; however, this is not required.

The final hardfacing deposit generally has a thickness such that the outer diameter of the box or threaded pin member that includes the hardfacing material has an outer diameter that is greater than (proud) the OEM outer diameter of the box or threaded pin member (see FIG. 8); however, this is not required. The resulting proud hardfacing deposit can be used to provide additional wear resistance to the work string tube for longer working tube life.

The hardfacing deposit can include a second layer of hardfacing deposit that is located anywhere on the surface of the original upset length. Typically, this deposit is located at or near the tapered region as shown in FIG. 9; however, this is not required. During work string tubing operation, the thicker, two-layer deposit area of the box will wear down first before wear occurs at or near the threaded end of the box, thereby resulting in longer life of the work string tube.

Figure 10:
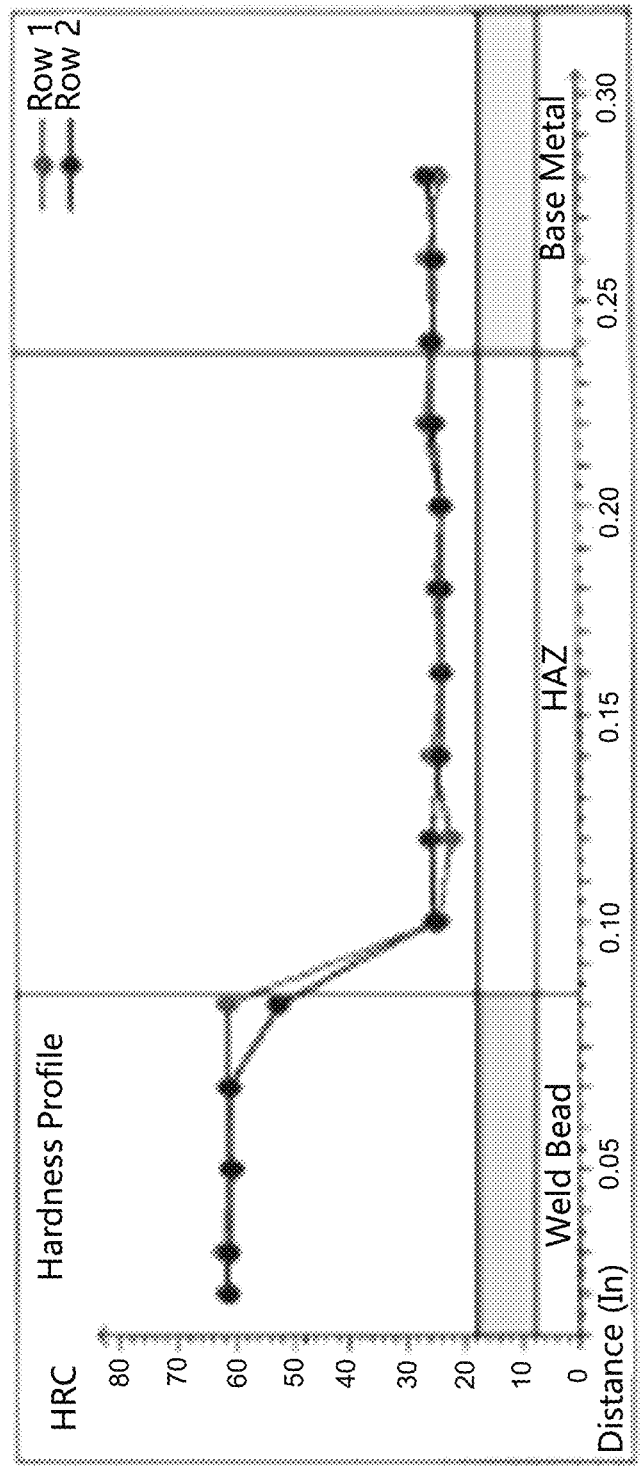
FIG. 10 is a graphical representation showing microhardness values versus inches in depth below the surface of the hardfacing of Duraband® NC.

As illustrated in FIG. 10, the Duraband® NC (heat affected zone) microhardness values are typically less than Rockwell 30. The heat affect zone is the zone wherein the metal of the OEM box and/or threaded pin member mixes with the composition of the hardfacing metal to create the bond between hardfacing metal and the box and/or threaded pin member. These low values will not contribute to any detrimental physical properties of the P110 physical properties. As illustrated in FIG. 10, the hardness of two tested rows of hardfacing metal applied to a box and/or threaded pin member of work string tubing formed of P110 alloy is about 62 Rc (ISO 6508-1). The thickness of the hardfacing metal coating prior to the heat affected zone was about 0.083 inches. The thickness of the heat affected zone was about 0.154 inches. The hardness values drop in the heat affected zone to less than 30 Rc. The lowest hardness value in the heat affected zone is generally equal to or less than the hardness value of the OEM box and/or threaded pin member. As illustrated in FIG. 10, the lowest hardness value in the heat affected zone is less than the hardness value of the OEM box and/or threaded pin member. The thickness of the heat affect zone was greater than a thickness of the layer of hardfacing metal. The minimum hardness of the heat affect zone is generally less than is less than a hardness of the hardfacing metal. Also, the minimum hardness of the heat affect zone is generally less than or equal to a hardness of the box and/or threaded pin member of work string tubing.

Figure 11:
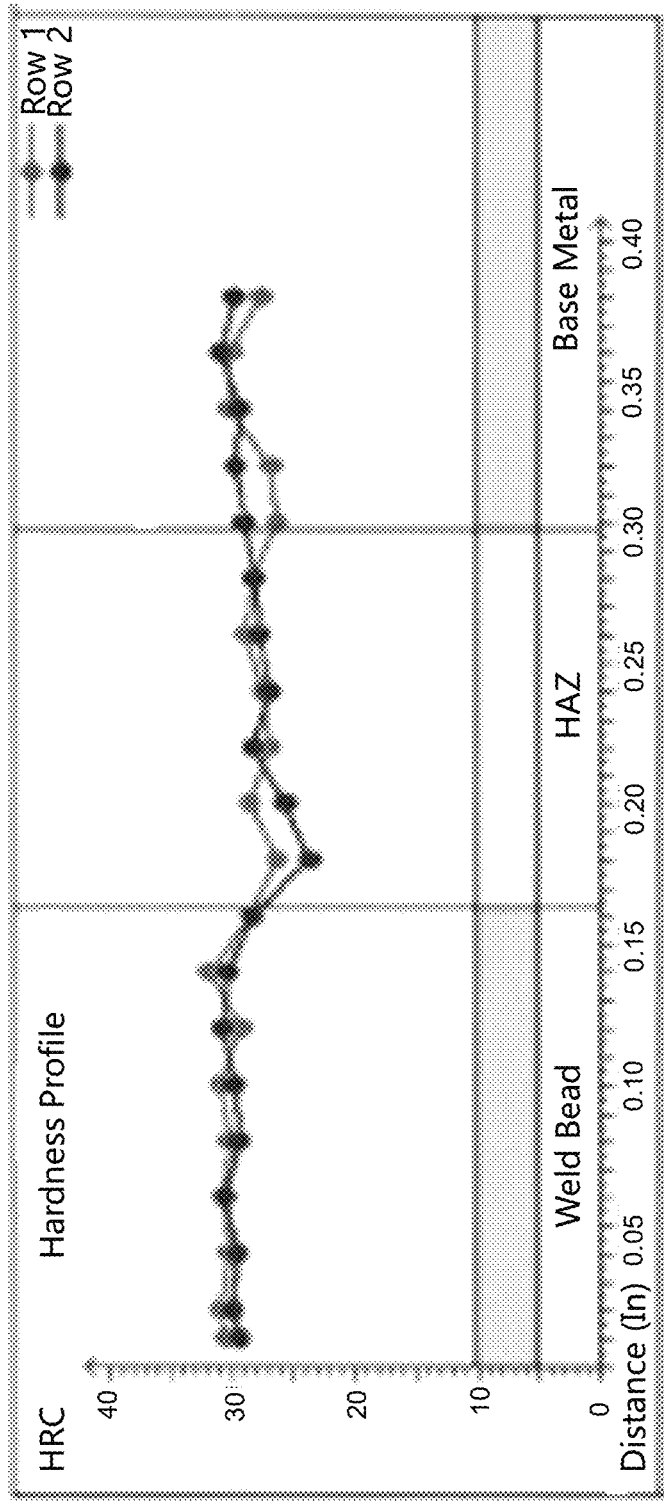
FIG. 11 is a graphical representation showing microhardness values versus inches in depth below the surface of the hardfacing of Postalloy® 2891.

As illustrated in FIG. 11, the Postalloy® 2891 (heat affected zone) microhardness values are typically less than Rockwell 30. These low values will not contribute to any detrimental physical properties of the P110 physical properties. As illustrated in FIG. 11, the hardness of two tested rows of hardfacing metal applied to a box and/or threaded pin member of work string tubing formed of P110 alloy is about 28-33 Rc (ISO 6508-1). The thickness of the hardfacing metal coating prior to the heat affected zone was about 0.163 inches. The thickness of the heat affected zone was about 0.116 inches. The hardness values drop in the heat affected zone to less than 30 Rc. The lowest hardness value in the heat affected zone is generally equal to or less than the hardness value of the OEM box and/or threaded pin member. As illustrated in FIG. 11, the lowest hardness value in the heat affected zone is less than the hardness value of the OEM box and/or threaded pin member. The thickness of the heat affect zone was less than a thickness of the layer of hardfacing metal. The minimum hardness of the heat affect zone is generally less than is less than a hardness of the hardfacing metal. Also, the minimum hardness of the heat affect zone is generally less than or equal to a hardness of the box and/or threaded pin member of work string tubing.

Figure 12:
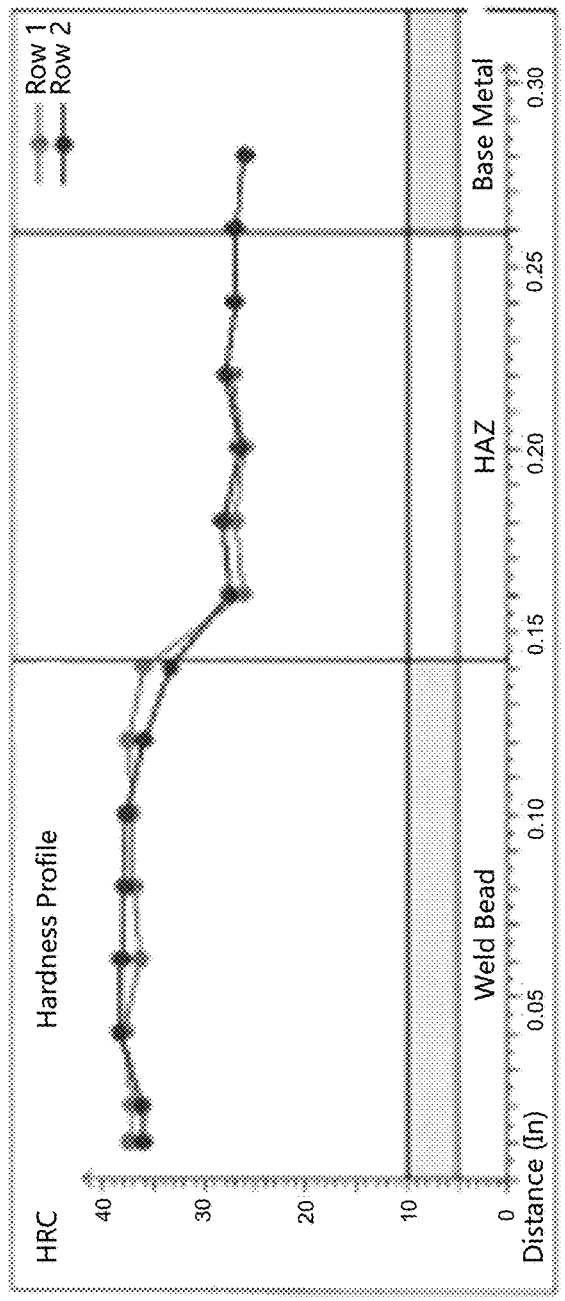
FIG. 12 is a graphical representation showing microhardness values versus inches in depth below the surface of the hardfacing of Postalloy® Tubewell 110™.

As illustrated in FIG. 12, the Postalloy® 2892 (heat affected zone) microhardness values are typically less than Rockwell 30. These low values will not contribute to any detrimental physical properties of the P110 physical properties. As illustrated in FIG. 12, the hardness of two tested rows of hardfacing metal applied to a box and/or threaded pin member of work string tubing formed of P110 alloy is about 33-38 Rc (ISO 6508-1). The thickness of the hardfacing metal coating prior to the heat affected zone was about 0.143 inches. The thickness of the heat affected zone was about 0.116 inches. The hardness values drop in the heat affected zone to less than 30 Rc. The lowest hardness value in the heat affected zone is generally equal to or less than the hardness value of the OEM box and/or threaded pin member. As illustrated in FIG. 12, the lowest hardness value in the heat affected zone is less than or about equal the hardness value of the OEM box and/or threaded pin member. The thickness of the heat affect zone is was less than a thickness of the layer of hardfacing metal. The minimum hardness of the heat affect zone is generally less than is less than a hardness of the hardfacing metal. Also, the minimum hardness of the heat affect zone is generally less than or equal to a hardness of the box and/or threaded pin member of work string tubing.

Figure 13:
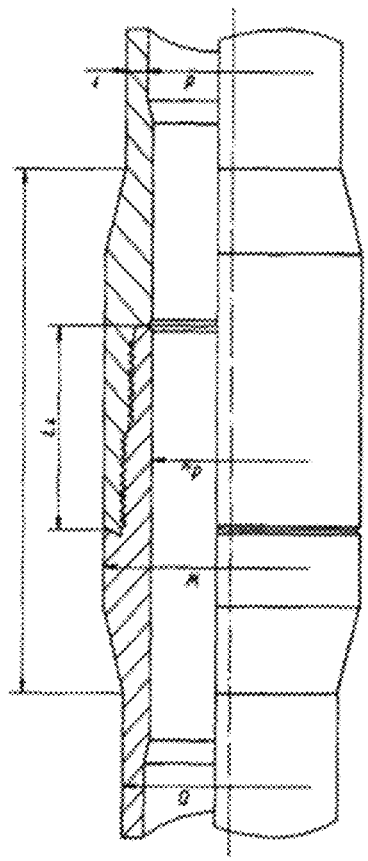
FIG. 13 is a cross-sectional illustration of work string tubing.

FIG. 13 is a cross-sectional illustration of a prior art work string tubing connection showing various dimensions of the tubing and connection, and the specific dimensions of such prior art tubing are provided as examples in FIGS. 14-15. These dimensions can be used as a general guide to determine how much of the box or threaded pin member can be removed when repairing the work string tubing. For example, if 0.5 inches of the front end of the box is removed, a similar amount of the front end of the threaded pin member may need to be removed so that the two work string tubings can be properly fit together. Also, if 0.5 inches of the front end of the box is removed, the longitudinal length of the cavity of the box can be extended by such length so that the two work string tubings can be properly fit together. As can be appreciated, the amount taken off of the front end of the box and/or threaded pin member will depend on how worn such regions are and/or to facilitate in the proper and desired connection with other work string tubing.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed:

1. A method for repairing a worn work string tubing that is not connected to another piece of work string tubing to minimize or prevent a) the softening or disfiguring of a box of said worn work string tubing, b) damage to threads in a cavity of said box of said worn work string tubing, c) formation of holes or other damage in thin or worn areas of said box of said worn work string tubing, d) damage to a threaded region of a threaded pin member of said worn work string tubing, or combinations thereof, said method includes:
   i) cutting off or otherwise removing a front end portion of said box, removing a front portion of said threaded region of said threaded pin member, or combinations thereof;
   applying a first layer of a hardfacing metal to an outer surface of said box in a direction from a front end of said box towards a back end of said box wherein said hardfacing metal is located above said threads in said cavity of said box, applying a first layer of said hardfacing metal to an outer surface of an upset portion of said threaded pin member in a direction from a front end of said upset portion to a back end of said upset portion, or combinations thereof;
   iii) further processing said box, said threaded pin member, or combinations thereof by grinding, polishing, deburring, heat treating, or combinations thereof after said step of applying; and, iv) repairing said threads or rethreading new threads in said cavity of said box, on said threaded region of said threaded pin member, or combinations thereof after said step of applying.

2. The method as defined in claim 1, further including the steps of:
   I) applying said first layer of said hardfacing metal to an outer surface of a tapered region of said box, to a region on a body of said work string tubing that is rearward of said end of said box, or combinations thereof and/or applying said first layer of said hardfacing metal to an outer surface of a tapered region of said upset portion, to a region on a body of said work string tubing that is rearward of said upset portion, or combinations thereof; and,
   II) extending a longitudinal length of said cavity of said box by cutting further into said cavity and/or lengthening a threaded region of said threaded pin member by cutting into a front face of said upset portion.

3. A method for repairing work string tubing that is used in well operations wherein said work string tubing is worn and is no longer approved to be used in the well comprising the steps of:
   a) providing a worn work string tubing that is worn and/or is no longer approved to be used in the well and which is not connected to another piece of work string tubing, said worn work string tubing comprising a body, a box located at one end of the body, and a threaded pin member having a threaded region located at the other end of the body, said box having a base body with a base outer surface, said base body having a base body front end, a base body back end, a cavity and threads located in said cavity, said base outer surface having a diameter that is less than 90% of an OEM diameter of said box, and/or an upset portion of said threaded pin member is less than 90% of an OEM outer diameter of said upset portion; and
   b) repairing said worn work string tubing to form a repaired work string tubing by I) applying a first layer of a hardfacing metal to said base outer surface of said box such that an outer diameter of said box is about 90-200% an OEM outer diameter of said box, and/or II) applying a first layer of a hardfacing metal to said upset portion of said threaded pin member such that an outer diameter of said upset portion is about 90-200% an OEM outer diameter of said upset portion; and,
   wherein said step of repairing is selected to minimize or prevent a) softening or disfiguring of said box, b) damage to said threads in said cavity of said box, c) formation of holes or other damage in thin or worn areas of said box, d) formation of holes or other damage to said body of said work string tubing, and/or e) damage to said threaded region of said threaded pin member; said step of repairing further includes:
   i) cutting off or otherwise removing a front end portion of said box prior to applying said first layer of said hardfacing metal to said box, and/or removing a front portion of said threaded region of said threaded pin member prior to applying said first layer of said hardfacing metal to said threaded region; ii) applying said first layer of said hardfacing metal to said outer surface of said box in a direction from a front end of said box towards a back end of said box wherein said hardfacing metal is located above said threads in said cavity of said box, and/or applying said first layer of said hardfacing metal to an outer surface of said upset portion of said threaded pin member in a direction from a front end of said upset portion to a back end of said upset portion; iii) further processing said box and/or said threaded pin member by grinding, polishing, deburring, and/or heat treating after applying said first layer of said hardfacing metal to said outer surface of said box and/or said outer surface of said upset portion of said threaded pin member; and/or iv) repairing said threads or rethreading new threads in said cavity of said box after applying said first layer of said hardfacing metal to said outer surface of said box, repairing said threaded region of said threaded pin member after applying said first layer of said hardfacing metal to said outer surface of said upset portion of said threaded pin member.

4. The method as defined in claim 3, wherein said first layer of said hardfacing metal covering 55-100% of said outer surface of said box.

5. The method as defined in claim 4, wherein a back portion of said box includes a tapered region, less than 30% of an outer surface of said tapered region is covered by said first layer of said hardfacing metal after said first layer of said hardfacing metal is applied to said outer surface of said box.

6. The method as defined in claim 5, further including the step of applying a second layer of hardfacing metal to at least a portion of an outer surface of said first layer of said hardfacing metal, said second layer of said hardfacing metal having an outer diameter that is 101-200% of said OEM diameter of said box.

7. The method as defined in claim 6, wherein said first and second layers of said hardfacing metal have a composition of I) about 0.5-2.5 wt.% carbon, about 0.0 1-2 wt.% manganese, about 0.0 1-2 wt.% silicon, about 4-11 wt.% chromium, about 3-9 wt% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt% molybdenum, and at least about 85 wt.% iron.

8. The method as defined in claim 7, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

9. The method as defined in claim 5, wherein said first layer of said hardfacing metal has a composition of I) about 0.5-2.5 wt.% carbon, about 0.0 1-2 wt.% manganese, about 0.0 1-2 wt.% silicon, about 4-11 wt.% chromium, about 3-9 wt% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt% molybdenum, and at least about 85 wt.% iron.

10. The method as defined in claim 5, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

11. The method as defined in claim 4, further including the step of applying a second layer of hardfacing metal to at least a portion of an outer surface of said first layer of said hardfacing metal, said second layer of said hardfacing metal having an outer diameter that is 101-200% of said OEM diameter of said box.

12. The method as defined in claim 11, wherein said first and second layers of said hardfacing metal have a composition of I) about 0.5-2.5 wt.% carbon, about 0.0 1-2 wt.% manganese, about 0.0 1-2 wt.% silicon, about 4-11 wt.% chromium, about 3-9 wt% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt% molybdenum, and at least about 85 wt.% iron.

13. The method as defined in claim 11, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

14. The method as defined in claim 4, wherein said first layer of said hardfacing metal has a composition of I) about 0.5-2.5 wt.% carbon, about 0.0 1-2 wt.% manganese, about 0.0 1-2 wt.% silicon, about 4-11 wt.% chromium, about 3-9 wt% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt% molybdenum, and at least about 85 wt.% iron.

15. The method as defined in claim 4, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

16. The method as defined in claim 3, wherein a back portion of said box includes a tapered region, less than 30% of an outer surface of said tapered region is covered by said first layer of said hardfacing metal after said first layer of said hardfacing metal is applied to said outer surface of said box.

17. A method for repairing work string tubing that is used in well operations wherein said work string tubing is worn and is no longer approved for use in the well, comprising the steps of:
  a) providing a single piece of worn work string tubing that is worn and/or is no longer approved for use in the well, said worn work string tubing comprising a body, a box located at one end of the body, and a threaded pin member having a threaded region located at the other end of the body, said box having a base body with a base outer surface, said base body having a base body front end, a base body back end, a cavity and threads located in said cavity, said base outer surface having a diameter that is less than 90% of an OEM diameter of said box; and
b) repairing said worn work string tubing to form a repaired work string tubing approved for use in the well by:
    removing a portion of a front end portion of said box;
    applying a first layer of a hardfacing metal to said outer surface of said box in a direction from a front end of said box towards a back end of said box, wherein said hardfacing metal is located above said threads in said cavity of said box, said first layer of said hardfacing metal is applied to 55-100% of said base outer surface of said box such that an outer diameter of said box is about 90-200% an OEM outer diameter of said box, said step of applying said first layer of said hardfacing metal is selected to minimize or prevent i) softening or disfiguring of said box, ii) damage to said threads in said cavity of said box, iii) formation of holes or other damage in thin or worn areas of said box, and/or iv) formation of holes or other damage to said body of said work string tubing;
    post-processing said box by I) grinding, polishing, deburring, and/or heat treating said box after step of applying said first layer of said hardfacing metal, and/or II) repairing said threads or rethreading new threads in said cavity of said box after step of applying said first layer of said hardfacing metal.

18. The method as defined in claim 17, wherein a back portion of said box includes a tapered region, less than 30% of an outer surface of said tapered region is covered by said first layer of said hardfacing metal after said first layer of said hardfacing metal is applied to said outer surface of said box.

19. The method as defined in claim 18, wherein said step of applying said hardfacing metal further includes the step of applying a second layer of said hardfacing metal to at least a portion of an outer surface of said first layer of said hardfacing metal, said second layer of said hardfacing metal having an outer diameter that is 101-200% of said OEM diameter of said box.

20. The method as defined in claim 19, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

21. The method as defined in claim 20, wherein said first layer of said hardfacing metal has a composition of I) about 0.5-2.5 wt.% carbon, about 0.0 1-2 wt.% manganese, about 0.0 1-2 wt.% silicon, about 4-1 1 wt.% chromium, about 3-9 wt.% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt.% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt.% molybdenum, and at least about 85 wt.% iron.

22. The method as defined in claim 17, wherein said step of applying said hardfacing metal further includes the step of applying a second layer of said hardfacing metal to at least a portion of an outer surface of said first layer of said hardfacing metal, said second layer of said hardfacing metal having an outer diameter that is 101-200% of said OEM diameter of said box.

23. The method as defined in claim 17, wherein said first layer of said hardfacing metal forms a bond with said base outer surface in a heat affect zone, said heat affect zone having a hardness that is less than a hardness of said first layer of said hardfacing metal, a minimum hardness of said heat affect zone is less than or equal to a hardness of said OEM base outer surface.

24. The method as defined in claim 17, wherein said first layer of said hardfacing metal has a composition of I) about 0.5-2.5 wt.% carbon, about 0.0 1-2 wt.% manganese, about 0.0 1-2 wt.% silicon, about 4-11 wt.% chromium, about 3-9 wt.% niobium, and at least about 70 wt.% iron; II) about 0.01-0.25 wt.% carbon, about 0.5-2.5 wt.% manganese, about 0.01-2 wt.% silicon, about 1-3.5 wt.% chromium, about 0.01-2 wt.% molybdenum, and at least about 85 wt.% iron; or III) about 0.01-1.2 wt.% carbon, about 0.01-1.5 wt.% manganese, about 0.0 1-1.5 wt.% silicon, about 1.5-4 wt.% chromium, about 0.01-3 wt.% molybdenum, and at least about 85 wt.% iron.

\* \* \* \* \*